United States Patent [19]
Kunimatsu

[11] Patent Number: 5,818,106
[45] Date of Patent: Oct. 6, 1998

[54] SEMICONDUCTOR DEVICE HAVING A CAPACITOR FORMED ON A SURFACE OF A CLOSURE

[75] Inventor: Yasuyoshi Kunimatsu, Kokubu, Japan

[73] Assignee: Kyocera Corporation, Kyoto, Japan

[21] Appl. No.: 564,500

[22] Filed: Nov. 29, 1995

[30]  Foreign Application Priority Data

Nov. 29, 1994  [JP]  Japan ................................. 6-294259

[51] Int. Cl.⁶ .......................... H01L 23/06; H01L 23/10; H01L 23/15
[52] U.S. Cl. .................. 257/703; 257/704; 257/795; 257/924; 361/811; 361/820
[58] Field of Search .................... 257/703, 704, 257/924, 705, 710; 361/782, 783, 811, 820, 821

[56]   References Cited

U.S. PATENT DOCUMENTS

| | | | |
|---|---|---|---|
| 4,654,694 | 3/1987 | Val | 357/74 |
| 4,743,302 | 5/1988 | Dumesnil et al. | 106/1.23 |
| 4,827,082 | 5/1989 | Horiuchi et al. | 124/52.4 |
| 5,047,374 | 9/1991 | Nicholson et al. | 501/127 |
| 5,162,062 | 11/1992 | Carroll et al. | 148/24 |
| 5,334,558 | 8/1994 | Dietz et al. | 501/41 |

FOREIGN PATENT DOCUMENTS

| | | | |
|---|---|---|---|
| 352051879 | 4/1977 | Japan | 257/924 |
| 355086144 | 6/1980 | Japan | 257/924 |
| 59-72751 | 4/1984 | Japan . | |
| 35913692 | 8/1984 | Japan | 257/924 |
| 0247058 | 11/1986 | Japan | 257/924 |
| 401251644 | 10/1989 | Japan | 257/924 |
| 2-302061 | 12/1990 | Japan . | |
| 402307255 | 12/1990 | Japan | 257/924 |
| 403123068 | 5/1991 | Japan | 257/924 |

*Primary Examiner*—Tom Thomas
*Assistant Examiner*—David Ostrowski
*Attorney, Agent, or Firm*—Loeb & Loeb LLP

[57]   ABSTRACT

A semiconductor device which includes a ceramic package main body, a semiconductor element and a closure for sealing the semiconductor element in the package. A capacitor is formed on an upper or lower surface of the closure. The capacitor has a dielectric film interposed between a pair of electrode films. The dielectric film includes a ceramic filler and an amorphous glass. The closure and the package main body are sealed. A terminal formed in the package main body and the electrode film of the capacitor are connected electrically. High-density packaging on a substrate can be achieved. High strength of the closure itself can be maintained. Thermal stress developed in the closure itself, or the conjugated portion between the closure and the package main body, can be suppressed. Reliability of a sealed structure in the semiconductor device for a long period of time can be increased.

10 Claims, 3 Drawing Sheets

SEMICONDUCTOR DEVICE HAVING A CAPACITOR FORMED ON A SURFACE OF A CLOSURE

BACKGROUND OF THE INVENTION 1. (Field of the Invention)

This invention relates to a semiconductor device having a semiconductor element loaded in a ceramic package.

2. (Description of the Prior Art)

In the past, a semiconductor device shown in FIG. 4 has been known.

In the Figure, the numeral 1 represents a ceramic package, and a semiconductor element 2 is accommodated in the ceramic package 1. The semiconductor element 2 is connected to the package 1 via a terminal 3 formed in the ceramic package 1, a pad 4 formed on the semiconductor element 2, and a wire 5 for linking the terminal 3 and the pad 4. Pins 6 are fixed to the lower surface of the package 1, and these pins 6 are connected to each of the terminal 3 of the package 1. A closure 7 for sealing the semiconductor element 2 is conjugated to the upper surface of the package 1.

FIG. 5 shows a perspective view showing the condition in which the semiconductor device is mounted on a substrate. In this figure, the reference numeral 8 represents a semiconductor device; the reference numeral 9 represents a capacitor; the reference numeral 10 represents a substrate; and the reference numerals 11 and 12 represent a line ($V_{DD}$) for supplying power supply and a signal line ($V_{SS}$).

Conventionally, as shown in FIG. 5, as a measure for preventing the entry of noises into $V_{DD}$ and $V_{SS}$ the capacitor 9 for removing noises is mounted on the upper surface of the substrate 10 immediately between $V_{DD}$ and $V_{SS}$.

However, in such a condition the entry of noises into $V_{DD}$ and $V_{SS}$ can be prevented. But the capacitor 9 must be mounted on the substrate 10, and there still remains a problem that high-density mounting on the substrate 10 is obstructed.

The semiconductor device shown in FIG. 6 is known to solve this problem. In the figure, the closure 7 of the package 1 is constructed of electrodes 13 and 14 and a dielectric 15, and when the closure 7 is fixed to the package 1, the electrodes 13 and 14 of the closure 7 are connected to the terminals of $V_{DD}$ and $V_{SS}$ (see Japanese Laid-Open Patent Publication No. 302061/1990).

Furthermore, a semiconductor device in which the closure of the package is used as a chip capacitor as disclosed in Japanese Laid-Open Patent Publication No. 72751/1984 or a semiconductor device in which a capacitor made by laminating a dielectric film on a metal film is formed on the surface of the semiconductor element side of the closure made of a metal as disclosed in Japanese Laid-Open Patent Publication No. 123068/1991 has been known.

However, there is a problem that since in the semiconductor device disclosed in Japanese Laid-Open Patent Publication No. 302061/1990, a dielectric is formed inside the closure, or since in the semiconductive device disclosed Japanese Laid-Open Patent Publication No. 72751/1984, the closure itself is a chip capacitor and a dielectric material is used, the strength of the closure itself is weaker than unlike the structural material used conventionally. For this reason, at the time of production of a semiconductor device, the closure is conjugated with the package main body to make its inside part as a sealed structure. But there is a problem that when the semiconductor device is mounted on a computer, cracks will be developed because of collision, and the sealed structure lacks reliability for a long period of time.

Furthermore, since the semiconductor device disclosed in Japanese Laid-Open Patent Publication No. 123068/1991 uses a metal closure, the difference between the metal closure and the ceramic package in thermal expansion coefficient is great. Thus, at the time of conjugating the closure with the package main body, the conjugated portion develops cracks by thermal stress, or at the time of mounting the semiconductor device on a computer, the conjugated portion develops cracks due to collision, whereby there is a problem that the sealed structure lacks reliability for a long period of time. Furthermore, when the closure itself is made of a dielectric material, there is a problem that the difference between the closure and the package is great in the same way as mentioned above, and cracks are liable to be developed owing to thermal stress.

SUMMARY OF THE INVENTION

It is an object of this invention to provide a semiconductor device which is possible to perform high-density packaging on a substrate and to increase reliability for a long period of time in a sealed structure.

As a result of repeating investigations on the above problem, it has been found that a capacitor in which a dielectric film composed of a ceramic filler and an amorphous glass is interposed with a pair of electrode films is formed on the upper surface and/or the lower surface of a closure, that the closure and the package main body are sealed and that a terminal formed in the package main body and the electrode film of the capacitor are connected electrically, whereby the high-density packaging on a substrate becomes possible. Thus, it has been found that the strength of the closure itself can be maintained high, the thermal stress developed in the closure itself or the conjugated portion between the closure and the package main body can be suppressed, whereby reliability of a sealed structure in the semiconductor device for a long period of time can be increased.

The semiconductor device of the present invention is composed of a ceramic package main body, a closure for sealing the package main body, and a semiconductor element to be mounted on the above package main body, wherein a capacitor obtained by interposing a dielectric film composed of a ceramic filler and an amorphous glass with an electrode film is formed on at least one of the upper surface and the lower surface of the closure, the closure and the package main body are sealed and the terminal formed on the package main body and the electrode film of the capacitor are electrically connected.

DETAILED DESCRIPTION OF THE PREFERRED EMBODIMENTS

Figure 1:
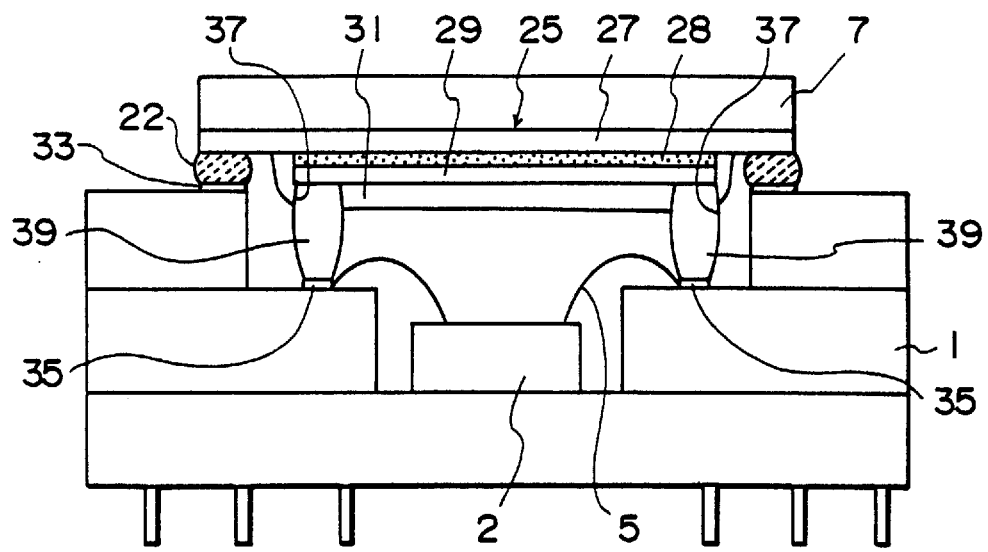
FIG. 1 is a vertical sectional view showing the semiconductor device of the present invention.

The package main body in the semiconductor device of this invention is composed of, for example, a ceramic such as alumina, silicon nitride($Si_3N_4$), mullite, aluminium nitride(AlN) and glass-ceramics. The closure is desirably composed of the same ceramic as the package main body. By so doing, even when the closure is conjugated with the package main body, thermal stress hardly occurs, and the conjugation strength can be increased.

The capacitor formed on the closure may be formed on the upper surface or the lower surface of the closure, or on both the upper surface and the lower surface of the closure. Since the capacitor is formed by a thick-film process, the thermal expansion coefficient of the closure itself is hardly affected by the presence of the capacitor.

The capacitor is obtained by interposing a dielectric film composed of the ceramic filler and the amorphous glass by an electrode film. Herein, the electrode film is formed by coating a paste composed of Ag—Pt or Ag—Pd by screen printing on the upper surface/or the lower surface of the closure.

The dielectric film is composed of the ceramic filler and the amorphous glass. Examples of the ceramic filler include general dielectric materials such as $SrTiO_3$, $BaTiO_3$, $Ba_{1-x}Sr_xTiO_3$, PZT($PbZr_{1-x}Ti_xO_3$) and PLZT ($Pb_{1-x}La_xZr_{1-y}Ti_yO_3$) as a highly dielectric material and $Al_2O_3$ or $SiO_2$ as fillers for increasing heat resistance. Examples of the amorphous glass include $SiO_2$—$B_2O_3$—CaO—$Al_2O_3$ type borosilicate glass. They are not limited to these glasses, and known amorphous glasses may be used.

The dielectric film may be formed by coating a dielectric paste containing a ceramic filler such as the above-mentioned $BaTiO_3$ and an amorphous glass such as a borosilicate glass and an organic component on the upper surface of the electrode film and baked at 600° to 900° C. The composition of the dielectric paste, as a solid component, desirably comprises 80 to 99% by weight of the ceramic filler and 1 to 20% by weight of the amorphous glass. It is desirable that the electrode film has a thickness of 10 to 20 μm and the dielectric film has a thickness of 10 to 20 μm.

In the package, the closure and the package main body are sealed with a solder having a melting temperature of not higher than 350° C., and the terminal formed in the package main body is electrically connected to the electrode film of the thick-film capacitor with a solder having a melting temperature of not higher than 350° C. The solder having a melting temperature of not higher than 350° C. includes, for example, high temperature solders (solders containing Ag or In) having excellent solder wettability, but is not limited thereto.

In the present invention, since the capacitor is formed on the upper surface and/or the lower surface of the closure, it is possible to prevent the entry of noises into the IC power supplies $V_{DD}$ and $V_{SS}$ by the capacitor and it is possible to form the capacitor inside the semiconductor device and to increase a packaging density onto the substrate.

Furthermore, since the closure can be formed of a high strength material, it is possible to increase the strength of the closure over a conventional closure formed from a dielectric material and also to prevent development of cracks due to collision and increase the reliability of the sealed structure for a long period of time.

Since the capacitor is formed by interposing a dielectric film composed of the ceramic filler and the amorphous glass with the electrode film, the dielectric constant can be adjusted by the selected ceramic filler and the glass acts as an adhesive can increase the conjugation strength with respect to the closure.

Furthermore, since this dielectric film can be formed by a thick-film process comprising coating a dielectric slurry, and baking the coating at a low temperature of 600° to 900° C., it can be easily formed on a closure composed of any material. In addition, since the baking temperature is low, the development of a thermal stress on the closure or the electrode film is small. Accordingly, the capacitor can be firmly formed on the closure without developing of peeling.

Since the amorphous glass is included in the dielectric film, the dielectric film is liable to flow at the time of baking and air bubbles trapped at the time of forming a thick film disappears. For this reason, the dielectric constant can be increased, and a flat electrode film can be formed on the dielectric film. When a crystalline glass is included in the dielectric film, since the dielectric film has low flowability, the air bubbles trapped at the time of forming the dielectric film remains at the time of baking. Accordingly, the dielectric constant is decreased, and it becomes difficult to form the electrode film in a flat form on the upper surface of the dielectric film. The present invention can solve the problem of such inconveniences.

Furthermore, since in the present invention the closure and the package main body are sealed by a solder having a melting temperature of not higher than 350° C. and the terminal of the package main body is electrically connected to the electrode film of the thick-film capacitor by a solder having a melting temperature of not higher than 350° C., it is not necessary to maintain a high temperature condition as compared with the sealing by the solder glass (having a melting temperature of about 450° C.) at the time of sealing the closure and the package main body, or at the time of connecting the terminal of the package main body to the electrode film of the capacitor. Thus, the variations of the composition due to the heating of the glass in the dielectric film are small, and the dielectric constant of the capacitor. When the melting temperature of the solder becomes higher than 350° C., the amorphous glass becomes very flowable, whereby the ceramic filler dispersed in the dielectric film becomes easy to aggregate partly and the dielectric constant is decreased.

According to this invention, since the closure is composed of the same ceramic as the package main body, the strength of the closure itself can be maintained at a high strength and a thermal stress generated in the closure itself or in a conjugated portion between the closure and the package main body can be suppressed, whereby reliability of the sealed structure in the semiconductor device can be increased for an extended period of time.

EXAMPLE

One example of the present invention will be described in details based on the accompanying drawings.

Figure 2:
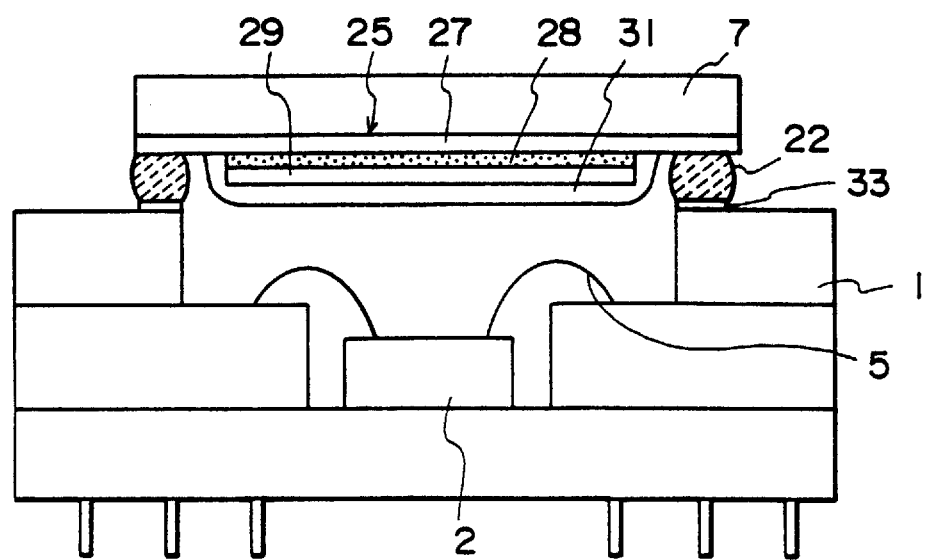
FIG. 2 is a transverse sectional view showing the semiconductor device of the present invention.
Figure 3:
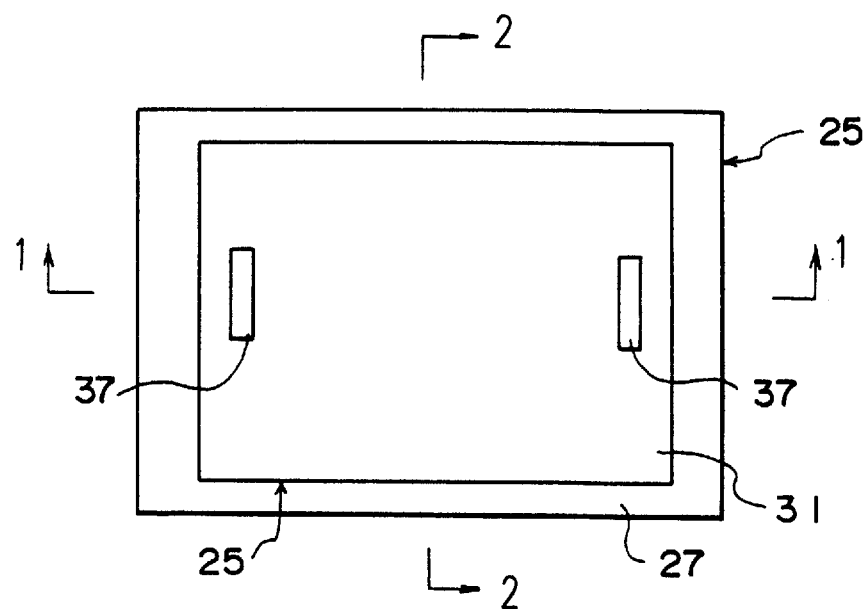
FIG. 3 is a bottom view (a top plan as seen from the lower surface side) showing the closure used in the present invention.
Figure 4:
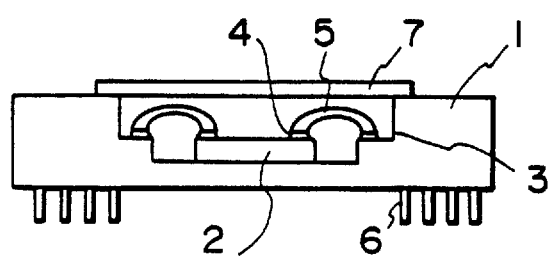
FIG. 4 is a vertical sectional view showing a conventional semiconductor device.
Figure 5:
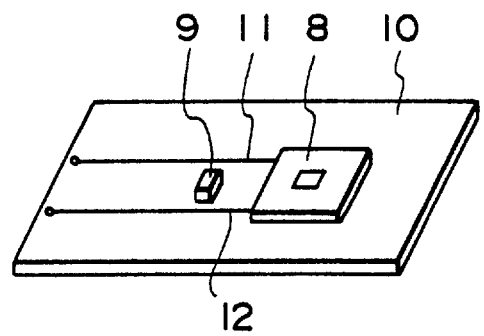
FIG. 5 is a perspective view showing a condition in which a conventional semiconductive device is mounted on a substrate; and, FIG. 6 is a vertical sectional view showing a conventional semiconductor device in which a closure itself is used as a capacitor.
Figure 6:
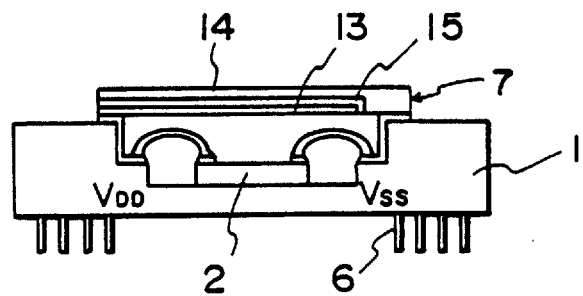

FIGS. 1 and 2 show the semiconductor device of the present invention. FIG. 3 shows a closure used in this invention.

FIG. 1 shows a sectional view shown by a line 1—1 in FIG. 3 in the semiconductor device on which the closure of FIG. 3 is mounted, and FIG. 2 shows a sectional view shown by a line 2—2 in FIG. 3. In FIGS. 1 and 2, the reference numeral 1 represents a package main body made of, for example, alumina.

A semiconductor element 2 made of silicon is arranged in a concave portion of this package main body 1, and the package 1 and the semiconductor element 2 are electrically connected by a wire 5. The closure 7 made of the same alumina as the package main body 1 is arranged in the upper portion of the package main body 1.

The capacitor 25 is formed on the surface (lower surface) of the semiconductor element side of the closure 7. On the lower surface of the closure 7, a first electrode film 27 composed of Ag/Pt or Ag/Pd, a dielectric film 28 composed of the ceramic filler such as $BaTiO_3$ and the amorphous glass such as $SiO_2$—$B_2O_3$—$CaO$—$Al_2O_3$ type borosilicate glass and a second electrode film 29 composed of Ag—Pt or Ag/Pd are successively formed. A protective film 31 such as a borosilicate glass is formed on the surface of the second electrode film 29.

The capacitor 25 is formed by the following process. First, an electrode paste containing Ag/Pd or Ag/Pt is coated on the surface of the closure 7, and baked at a temperature of 500° to 700° C. to form a first electrode film 27. Then, the dielectric slurry is coated on the surface of the first electrode film 27 and baked at a temperature of 600° to 900° C. to form a dielectric film. Thereafter, the same electrode paste as the first electrode film is coated on the surface of the dielectric film is coated on the surface of the dielectric film, and baked at a temperature of 500° to 700° C.

Furthermore, as shown in FIG. 1, the first electrode film 27 is formed entirely on the lower surface of the closure 7, and the second electrode film 29 and the dielectric film 28 are formed in a little bit smaller area than the area of the first electrode film 27. The periphery of the first electrode film 27 of the closure 7 is conjugated to a terminal 33 of the package main body 1 by, for example, a solder containing Ag or In which has a melting temperature of about 300° C., and this sealed portion 22 seals and protects the inside portion which accommodates the semiconductor element 2. The terminal 33 corresponds to the sealed portion 22, and is formed annularly about the concave portion of the package main body 1. The sealed portion 22 conjugates the lower surface of the closure 7 to the upper surface of the package main body 1, and the first electrode film 27 is electrically connected to the semiconductor element 2 via the sealed portion 22 and the terminal 33.

A terminal 35 to be electrically connected to the semiconductor element 2 is formed in the package main body 1. The second electrode film 29 is connected to the terminal 35 by means of a connecting portion 39 made up of a solder containing Ag or In and having a melting temperature of about 300° C. and filled in a window portion 37 of the protective film 31.

The capacity C of the capacitor is expressed by $C=\epsilon_o\epsilon_s A/d$. In the formula, $\epsilon_o$ is the dielectric constant of a vacuum, $\epsilon_s$ is the dielectric constant of the dielectric film 28, A is the area of the confronting electrode films 27 and 29, and d is the thickness of the dielectric film 28. For example, since the dielectric film 28 composed of the amorphous glass made, for example, of $BaTiO_3$ and a $CaO$—$Al_2O_3$—$SiO_2$ type has a dielectric constant of 25, when the thickness d of the dielectric film 28 is 25 $\mu$m and the area of the confronting electrode film 27 or 29 is 3.5 $cm^2$, the capacity C becomes 250 nF.

In the above Example, we explained the use of the package main body 1 and the closure 7 composed of lumina. But the package main body and the closure may be made of the same material. They may be made of $Si_3N_4$, mullite, AlN or glass ceramics. Furthermore, the package main body and the closure may be formed from different materials.

The materials of the dielectric film and the electrode films are not limited to the above examples. Furthermore, the dielectric film may comprise a plurality of film layers.

In the above Example, we have explained an example of forming a capacitor on the lower surface of the closure. But the capacitor may be formed on the upper surface of the closure, or on both the upper surface and the lower surface of the closure.

In the above Example, we have explained the case in which the sealing portion 22 for sealing the closure 7 on the packaging main body 1 performs a function of electrically connecting the first electrode film 27 to the terminal 33. The present invention will not be limited to the above Example. Separately from the connecting portion for electrically connecting the first electrode film to the terminal, a sealing portion for sealing the closure and the package main body may be provided. In this case, reliability of the sealed structure for a long period of time can further be increased.

What is claimed:

1. A semiconductor device, comprising:

a ceramic package main body, a semiconductor element, a closure for sealing the semiconductor element in the package main body, the closure having an upper surface and a lower surface, the closure and the package main body being sealed, a capacitor formed on at least one of the upper surface and the lower surface of the closure, the capacitor comprising a dielectric film interposed between a first electrode film and a second electrode film, the dielectric film comprising a ceramic filler and an amorphous glass, and a terminal formed in the package main body, the terminal and at least the first electrode film being electrically connected to each other, wherein the package main body comprises a ceramic material selected from the group consisting of alumina, $Si_3N_4$, mullite, AlN and glass-ceramics, and wherein the dielectric film comprises between about 80 to 99% by weight of the ceramic filler and between about 1 to 20% by weight of the amorphous glass.

2. The device of claim 1 wherein the capacitor comprises a capacitor formed by a thick film process, the dielectric film comprises a film baked at a temperature of between about 600° C. and about 900° C., and at least the first electrode film comprises a film baked at a temperature of about 500° C. and about 700° C.

3. The device of claim 1 wherein the closure and the package main body are sealed by a solder having a melting temperature greater than about 350° C., and the terminal and at least the first electrode film are electrically connected by a solder having a melting temperature greater than about 350° C.

4. The device of claim 1 wherein the package main body and the closure comprise substantially identical ceramic material.

5. The device of claim 1, wherein at least the first electrode film comprises at least one of Ag—Pt and Ag—Pd.

6. The device of claim 1, wherein the dielectric film comprises a ceramic filler comprising at least one of $SrTiO_3$ and $BaTiO_3$ and an amorphous glass comprising at least $CaO$—$Al_2O_3$—$SiO_2$.

7. The device of claim 1 wherein at least the first electrode film has a thickness of between about 10 and 20 $\mu$m and the dielectric film has a thickness of between about 10 and 20 $\mu$m.

8. The device of claim 1, wherein the capacitor is formed on the upper surface of the closure.

9. The device of claim 1, wherein the capacitor is formed on the lower surface of the closure.

10. The device of claim 1, wherein the capacitor is formed on both the upper and lower surfaces of the closure.

* * * * *